United States Patent [19]

Takemura

[11] Patent Number: 4,477,832

[45] Date of Patent: Oct. 16, 1984

[54] SOLID-STATE COLOR IMAGE PICKUP DEVICE N

[75] Inventor: Yasuo Takemura, Tokyo, Japan

[73] Assignee: Tokyo Shibaura Denki Kabushiki Kaisha, Kawasaki, Japan

[21] Appl. No.: 380,144

[22] Filed: May 20, 1982

[30] Foreign Application Priority Data

Jun. 10, 1981 [JP] Japan .................................. 56-88250

[51] Int. Cl.³ .............................................. H04N 9/07
[52] U.S. Cl. ...................................................... 358/44
[58] Field of Search ...................... 358/43, 44, 213, 41

[56] References Cited

U.S. PATENT DOCUMENTS 4,054,906 10/1977 Yamanaka ............................. 358/43
4,300,163 11/1981 Wada ................................... 358/213

FOREIGN PATENT DOCUMENTS 2904813 8/1979 Fed. Rep. of Germany ......... 358/44

Primary Examiner—Michael A. Masinick
Attorney, Agent, or Firm—Banner, Birch, McKie & Beckett

[57] ABSTRACT

A color filter array is provided on the surface of the device comprising a pattern of color filter elements corresponding to the pattern of photosensors. The color filter array has a plurality of separate filter elements arranged in horizontal and vertical rows, some of which are white (W) some of which are yellow (Ye), some of which are green (G) and the remaining elements are cyan (Cy), each of the elements corresponding to a respective photosensor. The horizontal rows of filter elements comprise a first horizontal row consisting of white and green elements alternately arranged, a second horizontal row consisting of yellow and cyan elements alternately arranged and positioned adjacent the first row, and each of the white filter elements of the first horizontal row are arranged in the same vertical row with a yellow filter element of the second horizontal row.

7 Claims, 7 Drawing Figures

FIG. 1

(PRIOR ART)

FIG. 2
(PRIOR ART)

| | Ye | Cy | Ye | Cy | Ye | Cy |
|---|---|---|---|---|---|---|
| 1 { | Ye | Cy | Ye | Cy | Ye | Cy |
| | G | W | G | W | G | W |
| 2 { | G | W | G | W | G | W |
| | Ye | Cy | Ye | Cy | Ye | Cy |
| 3 { | Ye | Cy | Ye | Cy | Ye | Cy |

FIG. 5

| | W | G | W | G | W | G |
|---|---|---|---|---|---|---|
| 1 { | W | G | W | G | W | G |
| | Ye | Cy | Ye | Cy | Ye | Cy |
| 2 { | Ye | Cy | Ye | Cy | Ye | Cy |
| | W | G | W | G | W | G |
| 3 { | W | G | W | G | W | G | ium
SOLID-STATE COLOR IMAGE PICKUP DEVICE N

BACKGROUND OF THE INVENTION

This invention relates to a color image pickup device using a solid-state device and especially to an improvement of a color filter device therefore.

Recently there has been considerable activity in developing color television cameras using solid-state image pickup devices. Among these, emphasis has been given to a single-plate type color television camera incorporating a single solid-state image pickup device, such as CCD, BBD, MOS devices or the like. In the case of single-plate type color TV cameras, experimentation has been directed to color filter arrays containing red, green and blue filter elements which are positioned adjacent the photosensors of the CCD. These elements are arranged in a finely checkered pattern, each one corresponding to a particular photosensor of the CCD. Examples of these prior art filter arrays are illustrated in FIGS. 1(A) and (B) which show the green filter elements (G) arranged in a checkered configuration and the remaining spaces being occupied by red (R) and blue (B) filter elements. In FIG. 1(A), R and B filter elements are not arranged along the same horizontal rows; while in FIG. 1(B), R and B filter elements are arranged along the same horizontal rows. Since interlaced scanning is normally used in television display systems, it is necessary to use a different arrangement of filter elements in adjacent pairs of rows, with the arrangement of filter elements within the rows of each pair being identical, as shown in FIGS. 1(A) and (B). For example, in FIGS. 1(A) and 1(B), the arrangement of filter elements within the rows of pair 1 are identical and the arrangement of elements within the rows of pair 2 are identical; however, the arrangement of filter elements in pair 1 are different than the arrangement of filter elements in adjacent pair 2.

As known in the prior art, the arrays shown in FIGS. 1(A) and 1(B) require the use of a 1H delay circuit (i.e., one horizontal line scan delay) to obtain a luminance signal (Y) corresponding to the brightness at each filter element. In FIG. 1(A), for example, by delaying the signals of the first line of pair 1 by 1H, coincidence is obtained with the scanning of the signals of the first line of pair 2. Thus, a green signal, from which the luminance signal is generated, is obtained for each filter element. The same luminance signal, however, is used for each pair of elements from which it was formed. For example, in FIG. 1(A), a luminance signal $Y_{5-6}$ is formed from element 5 and is used for elements 5 and 6. However, if element 5 receives a dark image while element 6 receives a bright image, the resultant luminance signal will be dark. This resulting signal, while accurately representing the dark image of element 5 will not accurately represent the bright image of element 6. This results in deterioration of the vertical resolution.

FIG. 2 shows another example of a prior art color filter array which overcomes the disadvantages mentioned above. In this filter array, four different kinds of color filter elements, green (G), yellow (Ye), cyan (Cy) and white (W), are periodically arranged. Namely, Ye and Cy are alternately arranged along adjacent horizontal rows within element pairs 1,3 and all remaining odd element pairs. G and W are also alternately arranged along adjacent horizontal rows within element pairs 2, 4 and all remaining even element pairs. The cyan filter passes blue and green, while the yellow filter passes green and red. Since all of the filter elements pass the G light, there is no need to supplement the signals by utilizing a 1H delay for correcting vertical resolution.

This conventional solid-state image pickup device, however, has a problem in reproducing color images. This device fails to reproduce pure red and yellow colors; in fact, pale red and greenish yellow are reproduced, respectively, instead of pure red and yellow colors.

It has been found that this problem is caused by light leakage to neighboring picture elements. This leakage results in deterioration of pure color reproduction, as discussed above. This light leakage phenomena in solid-state devices is explained below in detail. In a CCD (Charge Coupled Device) image pickup device, for example, a plurality of spaced photosensitive areas or photosensors are provided which are registered with the filter elements of the color filter array. Each of the photosensors generates an electric charge, the amount of which is proportional to light intensity passing through the corresponding color filter element. This generated charge is transferred by potential wells successively formed in the device. Since the potential wells are usually formed in a surface area of the device, the field intensity within the potential wells is weaker than in the deep areas of the device. Since red light has a longer wavelength than green or blue light, red light is capable of entering into the deep areas of the device. When high intensity red light is incident on the photosensors, the excess charge generated in the deep area tends to enter the adjacent potential wells over the low potential barrier. Thus leakage is shown at 7 in FIG. 2.

In a solid-state image pickup device (i.e., an interline transfer device), any horizontal leakage of the excess charge is prevented by vertical transfer channels or overflow drains isolating the horizontally adjacent photosensors from each other. In any event, excess charges generated by high intensity red light leak to vertically adjacent potential wells, as shown by the vertical arrows in FIG. 2. High intensity red light incident through the Ye and W filter elements generates a large quantity of charges, and the excess charges vertically leak into adjacent green (G) and cyan (Cy) areas. This leakage, as discussed above, causes deterioration of the reproduced color image quality.

SUMMARY OF THE INVENTION

It is an object of the invention to provide a solid-state color image pickup device which reproduces high quality color images.

It is a specific object of the invention to provide a solid-state image pickup device which improves the purity of the color images reproduced.

According to the invention, an interline transfer device is provided as a solid-state image pickup device. The device has a photosensor array having a plurality of spaced photosensors arranged in horizontal and vertical rows. Vertical rows of photosensors are separated from adjacent vertical rows by vertical charge transfer channels and overflow drains formed along the vertical direction in the device.

A color filter array is provided on the surface of the device comprising a pattern of color filter elements corresponding to the pattern of photosensors. The color filter array has a plurality of separate filter elements arranged in horizontal and vertical rows, some of which are white (W), some of which are yellow (Ye), some of which are green (G) and the remaining elements are cyan (Cy), each of the elements corresponding to a respective photosensor. The horizontal rows of filter elements comprise a first horizontal row consisting of white and green elements alternatively arranged, a second horizontal row consisting of yellow and cyan elements alternately arranged and positioned adjacent the first row, and each of the white filter elements of the first horizontal row are arranged in the same vertical row with a yellow element of the second horizontal row.

According this arrangement of the filter elements, the white and yellow filters are positioned adjacent each other in the same vertical row. Thus, the excess vertical charge leakages caused by high intensity red light being incident through the W and Ye filter elements are cancelled. That is, the leakage produced by the yellow filter across the barrier between the white and yellow filter cancels the leakage produced by the white filter. Consequently, color image quality and purity is not adversely effected.

BRIEF DESCRIPTION OF THE DRAWINGS

A complete understanding of the present invention and of the above and other objects thereof may be gained from a consideration of the following detailed description of a specific illustrative embodiment presented hereinbelow in connection with the accompanying drawings, in which:

Figure 1:
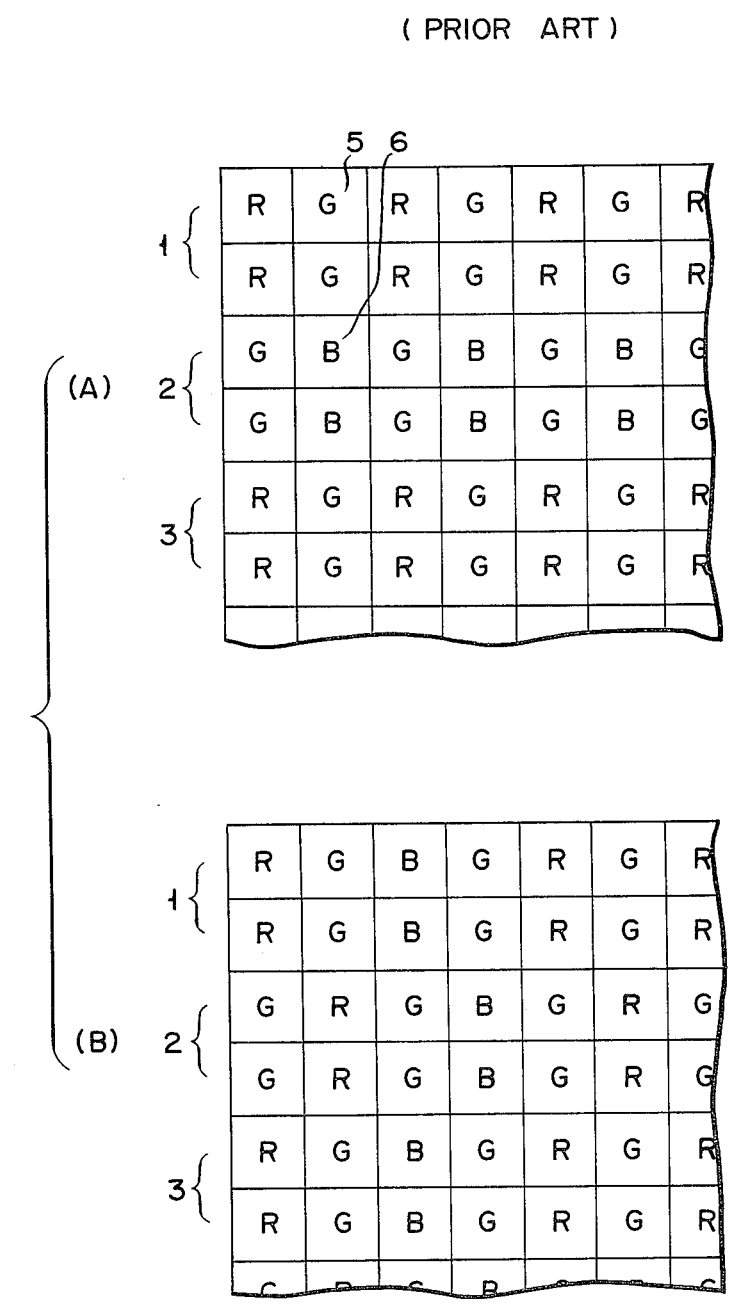

FIGS. 1 and 2 are schematic diagrams showing examples of conventional color filter arrays for use in solid-state color image pickup devices;

FIG. 5 is a partial view of a color filter array for the color image pickup device according to this invention;

DETAILED DESCRIPTION OF THE PREFERRED EMBODIMENT

Figure 3:
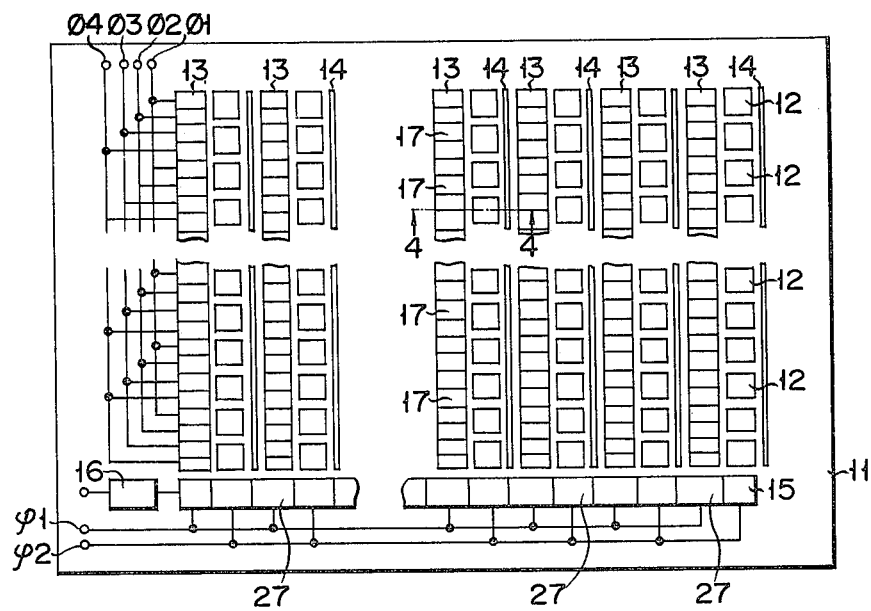
FIG. 3 is a schematic view showing a CCD image pickup device according to the invention.

FIG. 3 shows a plan view of a CCD color image pickup device made in accordance with the present invention. A p-type silicon semiconductor substrate 11 is provided on which a number of photodiodes or photosensors 12 are formed on the surface thereof. Photosensors 12 are arranged in a matrix pattern having 492 horizontal rows and 380 vertical rows to provide a photo sensitive area of $6.6 \times 8.8$ mm$^2$. Vertical transfer channels 13 and overflow drains 14 are placed between each vertical row of photosensors 12. A horizontal line transfer channel 15 is placed near a common end of vertical transfer channels 13. An output device 16 is formed on the surface of the substrate 11 for amplifying the signal transferred by line transfer channel 15.

Figure 4:
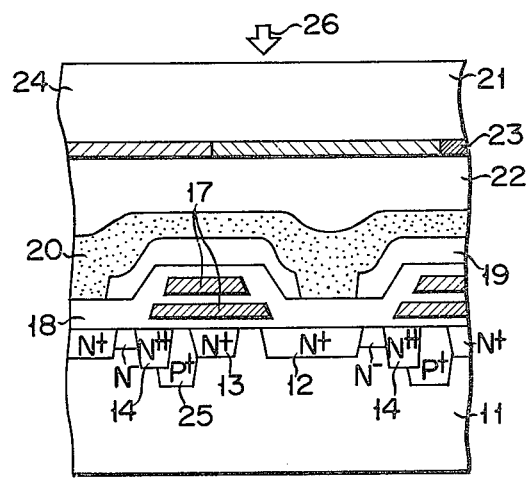
FIG. 4 is a partial cross-sectional view schematically showing the device taken along line 4—4 in FIG. 3.

A partial cross-sectional view of the CCD device taken along line 4—4 in FIG. 3 is schematically shown in FIG. 4 together with a color filter array provided on the surface of the CCD device. Photodiodes 12 are formed by a N+ type diffused region at the surface of a p-type substrate 11. Vertical transfer channels 13 are also N+ type diffused areas positioned adjacent each vertical row of photosensors 12 for receiving and transferring the charges along the vertical row of photosensors. Placed over vertical transfer channels 13 are transfer electrodes 17 made of polysilicon. Transfer electrodes 17 are buried in a SiO$_2$ layer 18 on the surface of the substrate 11. Two electrodes 17 are provided for each photosensor 12, partly overlapping each other, as shown in FIG. 3. Aluminum light shield layers 19 are provided on the SiO$_2$ layer 18 covering all surface areas except for photosensor areas 12. Light shield layers 19 are electrically biased so that any excess charges generated in photosensor areas 12 will flow into overflow drains 14, instead of flowing into vertical transfer channel 13. Overflow drains 14 are formed by N++ diffused regions. P+ regions 25 are channel stopping regions which isolate vertical transfer channels 13 from overflow drains 14.

Light shield layers 19 and SiO$_2$ layer 18 are coated by PSG glass layer 20. A color filter array 21 is laminated on PSG glass layer 20 by a binding layer 22. Color filter array 21 has filter elements 23 formed on the lower surface of a glass subtrate 24.

Light image incident on the device, as shown by arrow 26, is divided into its components colors while passing through filter array 21. Each component color light is converted into an electrical charge, and temporarily stored, by photosensors 12. This charge is read out when transferred into vertical transfer channels 13 under the control of transfer electrode 17 during the vertical retrace period. Transfer electrodes 17 are driven by 4 phase drive signals $\phi_1$–$\phi_4$, as shown in FIG. 3. Electrodes 17 sequentially transfer the charge of one picture element during the horizontal retrace period along vertical transfer channels 13 towards line transfer channel 15. For simplicity, FIG. 3 shows only the leftmost vertical transfer electrodes 17 driven by the drive signals. It should be clear that the transfer electrodes of the other vertical transfer channels are driven in the same manner. Line transfer channel 15 also has transfer electrodes 27 which are driven by 2 phase drive signals $\phi_1$ and $\phi_2$. The charges transferred along vertical transfer channels 13 are then sequentially transferred along the line transfer channels 15 during each horizontal scanning period and are supplied through output device 16.

A color filter array according to the invention is shown in FIG. 5. FIG. 5 shows only a portion of the filter array of $492 \times 380$ filter elements, each element having an area of $13 \times 32$ $\mu$m$^2$. As shown, a different arrangement of filter elements are in adjacent pairs of rows (e.g., row pair 1 and row pair 2), but an identical arrangement of elements are within the rows of each pair. For example, in the first and second rows of pair 1 and the remaining odd element pairs, the W and G elements are alternately arranged. In the first and second horizontal rows of pair 2 and the remaining even element pairs, the Ye and Cy elements are alternately arranged. As shown, each of the W filter elements in one pair are arranged in the same vertical row with the Ye filter elements of an adjacent pair. The first row of elements within each pair are scanned by a first field scanning of an interlaced scanning system normally used in commercial TV cameras. The second row of elements within each pair are scanned by a second field scanning of the interlaced scanning system.

As already explained, since the W and Ye filter elements allow the red light to pass, an excess charge will be generated by high intensity red light. These charges will flow in both directions between the W and Ye region as shown by opposite arrows 8, 9 in FIG. 5. This opposite charge flow across the barrier will cancel each other. The excess charges generated in the W and Ye regions will not, however, flow horizontally towards the adjacent G and Cy elements due to the presence of vertical channels 13 and overflow drains 14. It is apparent, moreover, that no excess charge is generated in the G and Cy picture element regions since these elements do not pass red light. Consequently, the G and Cy elements do not produce the leakage problem discussed above.

Figure 6:
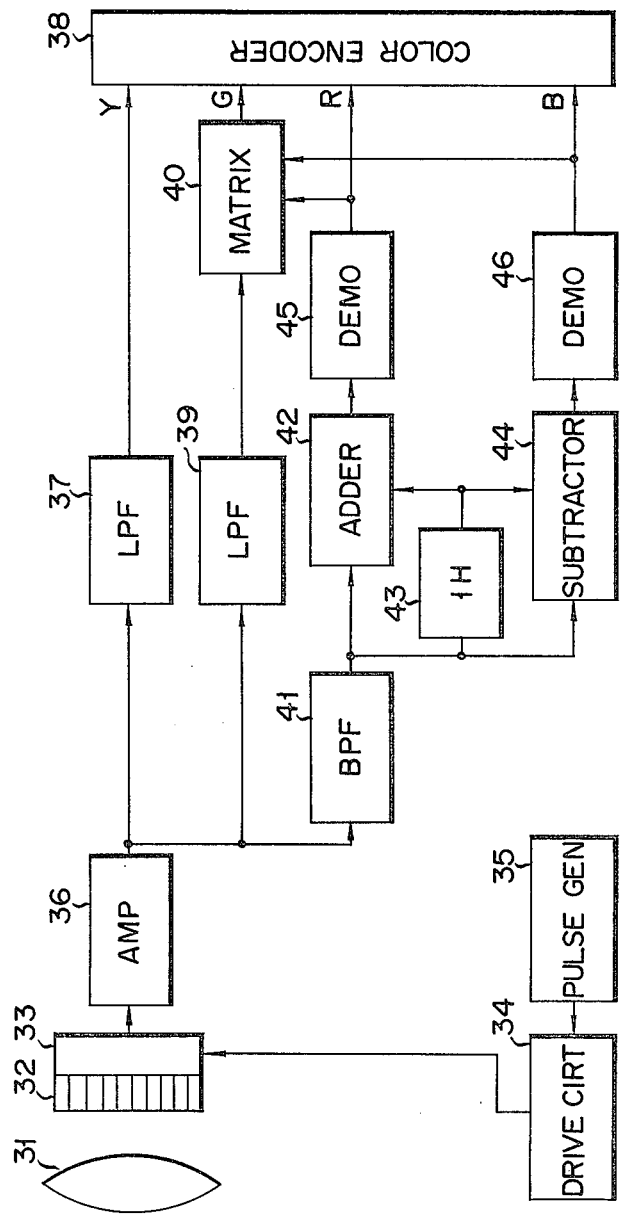
FIG. 6 is a block diagram of a color signal processor incorporated in the device according to this invention.

FIG. 6 shows a schematic diagram of a single plate type color television camera system incorporating the CCD device mentioned above. Incident light images passing through a lens 31 and a color filter array 32 (e.g., see FIG. 5) projects the image on the photosensitive surface of the CCD device 33 (e.g., FIGS. 3 and 4).

Figure 7:
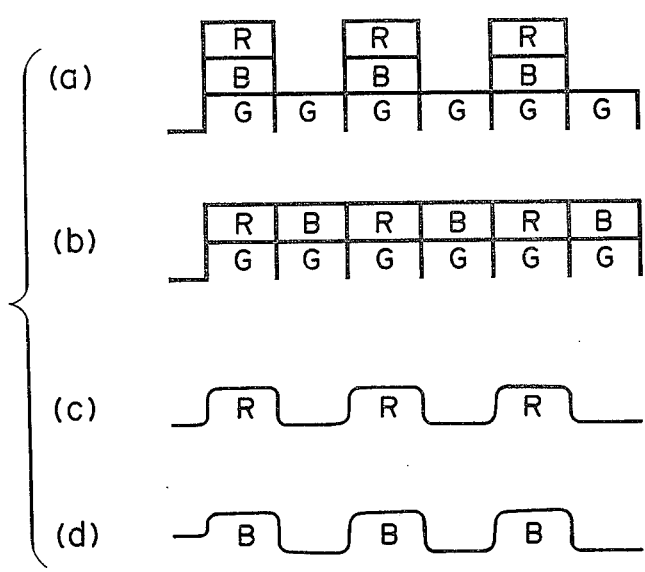
FIG. 7 is a diagram explaining the signal processing operation in the color signal processor shown in FIG. 6.

CCD device 33 is driven by pulse signals fed to it from a drive circuit 34. Drive circuit 34 generates various kinds of pulse signals which are required to generate an output image signal. Drive circuit 34 is synchronously coupled with pulse generator 35 which generates a timing pulse for controlling the circuits shown in FIG. 6. Since the CCD device incorporates interlaced scanning, the first line scan along the first row of pair 1 of the filter array shown in FIG. 5 gives R+G+B, G, R+G+B, G, . . . , as shown in FIG. 7(a), where R+G+B and G signals are repeated alternately. On the other hand, the second line scan along the first of pair 2 of the filter array gives R+G, G+B, R+G, G+B, . . ., as shown in FIG. 7(b). The repeat cycle is normally 3.58 MHz; this corresponds to the color subcarrier signal frequency in standard NTSC color TV signals.

The output signal from CCD device 33 is amplified by a wide band amplifier 36. Amplifier 36 may be an amplifier having a sample and hold function controlled by output pulses from pulse generator 35. The output signal from amplifier 36 passes through a first low pass filter (LPF) 37 which passes frequencies below 3 MHz to provide a luminance signal Y. Luminance signal Y is then fed to a color encoder 38. The output signal of amplifier 36 is supplied to a second LPF 39 which passes frequencies below 0.5 MHz to provide a low frequency color signal. This low frequency color signal is then fed to a color matrix circuit 40. The output signal of amplifier 36 further passes through a band pass filter (BPF) 41 which passes frequencies from 3 MHz to 4 MHz centered on 3.58 MHz. A color subcarrier signal, having 3.58 MHz frequency modulated by the received color components, is extracted at the output of BPF 41. This color subcarrier signal is fed to a 1H delay circuit 43 and a substraction circuit 44. Circuit 43 provides one horizontal scanning period delay. The output signal from 1H delay circuit 43 is fed to addition circuit 42 and to subtraction circuit 44.

Since the output signal from BPF 41 constitutes a component of the modulated waveforms of FIGS. 7(A) and (B), obtained by interlaced scanning, the subcarrier signal which is modulated by only the R signal (FIG. 7(c)) is isolated at the output of addition circuit 42. Likewise, the subcarrier signal which is modulated by only the B signal (FIG. 7(D)) is produced at the output of subtraction circuit 44. These color modulated subcarrier signals are then demodulated by a first and second demodulation circuit 45 and 46, to obtain at their outputs the R and B signal, respectively. The signal which passes through the second LPF 39 is converted to an unmodulated low frequency signal having an amplitude of R/2+G+B/2. This signal is fed to color matrix circuit 40 together with the R and B signals from first and second demodulation circuits 45, 46. Matrix circuit 40 generates G signals at its output by processing the three input color signals. The Y signal obtained from first LPF 37 and the three color signals R, G and B thus obtained are supplied to a color encoder 47, which generates NTSC color TV signals.

The above embodiment of the invention was explained for a case in which a CCD was incorporated, it is, however, possible to replace the CCD device with other solid-state image pickup devices such as, for example, BBD.

I claim:

1. A solid-state color image pickup device comprising:
   a semiconductor substrate;
   a photosensor array formed on the substrate having a plurality of photosensors arranged in horizontal rows and vertical rows, each photosensor generating a charge upon receipt of an image;
   vertical transfer means, positioned adjacent each vertical row of photosensors, for receiving the charges generated by the adjacent photosensors and transferring the charges along the vertical row to a line transfer means;
   a line transfer means, positioned adjacent one end of each vertical row of photosensors for receiving the charges transferred by the vertical transfer means, and transferring them to an output terminal formed on the substrate; and
   a color filter array having a plurality of separate filter elements arranged in horizontal and vertical rows, comprising white (W), yellow (Ye), green (G) and cyan (Cy) filter elements, each of said elements corresponding to a respective photosensor;
   said horizontal rows of filter elements comprising:
   a first pair of identical horizontal rows comprising white elements; and
   a second pair of identical horizontal rows, positioned adjacent the first pair, comprising yellow elements, wherein each of said white filter elements of the first pair is arranged in the same vertical row with a yellow filter element of the second pair.

2. The solid-state color image device of claim 1 wherein said first row consists of white and green elements alternately arranged and the second row consists of yellow and cyan elements alternately arranged.

3. A solid-state color image pickup device according to claim 2, wherein the white filter elements pass the light of red, green and blue colors, the green filter elements pass the light of only green color, the yellow filter elements pass the light of only red and green colors, and the cyan filter elements pass the light of only green and blue colors.

4. A solid-state color image pickup device according to claim 3, further comprising:
   a driving means for driving the vertical and horizontal transfer means to generate a color image output signal,
   a first filter means coupled to said color image output signal for extracting a luminance signal (Y);
   a second filter means coupled to said color image output signal for extracting low frequency components of the luminance signal (Y);
   a band pass filtering means coupled to said color image output signal for extracting a modulated color signal;

a 1H delay circuit coupled to said bandpass filtering means for producing a 1H delayed output signal;

a summing means for summing said modulated output signal with said 1H delayed output signal to produce a modulated red color signal;

a substracting circuit for subtracting said modulated output signal with said 1H delayed output signal to produce a blue modulated color signal;

a red signal demodulating means for demodulating said red modulated color signal to obtain a red color signal;

a blue signal demodulating means for demodulating said blue modulated color signal to obtain a blue color signal;

a color matrix means coupled to said blue and red signal demodulating means for producing a green color signal; and, a color encoder means for producing standard color television signals.

5. A solid-state color image pickup device according to claim 4, wherein said first filter means passes frequencies below approximately 3 MHz, said second filter means passes frequencies below approximately 0.5 MHz and the band pass filter means passes frequencies from approximately 3 MHz to 4 MHz.

6. In a solid-state color image pickup device adapted for interlaced scanning comprising a semiconductor substrate, a photosensor array formed on the substrate having a plurality of photosensors arranged in horizontal rows and vertical rows, each photosensor generating a charge upon receipt of an image, vertical transfer means positioned adjacent each vertical row of photosensors for receiving the charges generated by the adjacent photosensors and transferring the charges along the vertical row, line transfer means positioned adjacent one end of each vertical row of photosensors for receiving the charges transferred by the vertical transfer means and transferring them to an output terminal, and a color filter array having a plurality of separate filter elements arranged in horizontal and vertical rows, each filter element corresponding to a respective photosensor, a method of reducing charge leakage between adjacent photosensors, said method comprising the steps of:

separating each vertical row of photosensors from the vertical transfer means for an adjacent vertical row of photosensors by an overflow drain;

arranging the filter elements so that each vertical row of filter elements consists of either only white and yellow elements or only green and cyan elements; and arranging the filter elements so that each horizontal row of filter elements scanned by a first field scanning consists of either only white and green elements or only yellow and cyan elements, and each horizontal row of filter elements scanned by a second field scanning is identical to an adjacent horizontal row scanned during the first field scanning.

7. In a solid-state color image pickup device adapted for interlaced scanning comprising a semiconductor substrate, a photosensor array formed on the substrate having a plurality of photosensors arranged in horizontal rows and vertical rows, each photosensor generating a charge upon receipt of an image, vertical transfer means positioned adjacent each vertical row of photosensors for receiving the charges generated by the adjacent photosensors and transferring the charges along the vertical row, line transfer means positioned adjacent one end of each vertical row of photosensors for receiving the charges transferred by the vertical transfer means and transferring them to an output terminal, and a color filter array having a plurality of separate filter elements arranged in horizontal and vertical rows, each filter element corresponding to a respective photosensor, a method of reducing charge leakage between adjacent photosensors, said method comprising the steps of:

separating each vertical row of photosensors from the vertical transfer means for an adjacent vertical row of photosensors by an overflow drain;

arranging the filter elements so that each vertical row of filter elements consists of either only white and yellow elements or only green and cyan elements; and arranging the filter elements in pairs of horizontal rows so that the two rows in each pair are identical and consist of either only white and green elements or only yellow and cyan elements, one row of each pair being scanned during each field scanning of the interlaced scanning.

* * * * *